United States Patent
Lee et al.

(10) Patent No.: US 8,907,435 B2
(45) Date of Patent: Dec. 9, 2014

(54) SEMICONDUCTOR MEMORY AND MANUFACTURING METHOD THEREOF

(71) Applicant: SK Hynix Inc., Gyeonggi-do (KR)

(72) Inventors: Min Suk Lee, Gyeonggi-do (KR); Byung Gu Gyun, Daejeon (KR); Bo Kyoung Jung, Gyeonggi-do (KR); Chang Hyup Shin, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 82 days.

(21) Appl. No.: 13/846,397

(22) Filed: Mar. 18, 2013

(65) Prior Publication Data

US 2013/0221462 A1    Aug. 29, 2013

Related U.S. Application Data

(62) Division of application No. 13/187,782, filed on Jul. 21, 2011, now Pat. No. 8,420,408.

(30) Foreign Application Priority Data

Jul. 21, 2010   (KR) .......................... 10-2010-0070527

(51) Int. Cl.
*H01L 29/82* (2006.01)
*H01L 43/12* (2006.01)

(52) U.S. Cl.
CPC ............. *H01L 29/82* (2013.01); *H01L 43/12* (2013.01)
USPC ........................................................ 257/421

(58) Field of Classification Search
USPC ....................................................... 257/421
See application file for complete search history.

(56) References Cited

U.S. PATENT DOCUMENTS

| | | | | |
|---|---|---|---|---|
| 6,538,861 | B1* | 3/2003 | Hayashi et al. | 360/324.2 |
| 7,688,615 | B2* | 3/2010 | Ho et al. | 365/157 |
| 7,948,044 | B2* | 5/2011 | Horng et al. | 257/421 |
| 7,985,667 | B2* | 7/2011 | Cho | 438/553 |
| 7,998,758 | B2* | 8/2011 | Ahn et al. | 438/3 |
| 8,058,080 | B2* | 11/2011 | Kajiyama et al. | 438/3 |
| 2004/0129361 | A1* | 7/2004 | Chen et al. | 156/58 |
| 2004/0137749 | A1* | 7/2004 | Ying et al. | 438/710 |
| 2007/0187785 | A1* | 8/2007 | Hung et al. | 257/421 |
| 2008/0073750 | A1* | 3/2008 | Kanaya | 257/532 |
| 2009/0078927 | A1* | 3/2009 | Xiao et al. | 257/9 |
| 2009/0130779 | A1* | 5/2009 | Li et al. | 438/3 |
| 2009/0206425 | A1* | 8/2009 | Tsujiuchi | 257/421 |
| 2010/0097846 | A1* | 4/2010 | Sugiura et al. | 365/158 |
| 2010/0193891 | A1* | 8/2010 | Wang et al. | 257/421 |
| 2011/0037108 | A1* | 2/2011 | Sugiura et al. | 257/295 |
| 2011/0171755 | A1* | 7/2011 | Murata et al. | 438/3 |
| 2011/0235217 | A1* | 9/2011 | Chen et al. | 360/324.2 |
| 2012/0028373 | A1* | 2/2012 | Belen et al. | 438/3 |

FOREIGN PATENT DOCUMENTS

JP    2011138822 A  *  7/2011

* cited by examiner

*Primary Examiner* — George Fourson, III
(74) *Attorney, Agent, or Firm* — IP & T Group LLP (57) ABSTRACT

A method for manufacturing a semiconductor memory device includes sequentially depositing a bottom electrode layer, a magnetic tunnel junction (MTJ) layer, a first top electrode layer, a second top electrode layer and a mask layer, etching the mask layer and forming a mask pattern, etching the second top electrode layer and the first top electrode layer by using the mask pattern as an etch barrier, etching the MTJ layer by using the mask layer and the second top electrode layer as an etch barrier, and etching the bottom electrode layer by using the first top electrode layer as an etch barrier.

7 Claims, 8 Drawing Sheets

PRIOR ART

SEMICONDUCTOR MEMORY AND MANUFACTURING METHOD THEREOF

CROSS-REFERENCE(S) TO RELATED APPLICATIONS

This application is a division of U.S. patent application Ser. No. 13/187,782 filed on Jul. 21, 2011, which claims priority of Korean Patent Application No(s). 10-2010-0070527, filed on Jul. 21, 2010. The disclosure of the foregoing application is incorporated herein by reference in its entirety.

BACKGROUND OF THE INVENTION

Exemplary embodiments of the present invention relate to a memory device using a semiconductor and a manufacturing method thereof, and more particularly, to a memory device using a magnetoresistive memory and a manufacturing method thereof.

A dynamic random access memory (DRAM) is a widely used semiconductor memory. However, a DRAM is reaching limits in scaling-down and obtaining adequate capacitance for capacitors in storing data. To address such features, different types of memory devices are being developed including a magnetoresistive random access memory (MRAM) using tunneling magneto-resistance.

An MRAM is a nonvolatile memory device to store data using a magneto-resistance change depending on magnetization directions of two ferromagnetic layers constituting a magnetic tunnel junction (MTJ). The MTJ has a stack structure of a ferromagnetic layer, an insulation layer, and a ferromagnetic layer. At this time, one of the two ferromagnetic layers is a pinned layer (PL) whose magnetization direction is pinned, and the other is a free layer (FL) whose magnetization direction is changed by a current passing therethrough.

When electrons tunneling through the first ferromagnetic layer pass through the insulation layer used as a tunneling barrier, the tunneling probability changes depending on the magnetization direction of the second ferromagnetic layer. More specifically, the tunneling probability is the highest when the magnetization directions of the two ferromagnetic layers are parallel to each other and is the lowest when the magnetization directions of the two ferromagnetic layers are anti-parallel to each other. Therefore, stored data can be read by using a difference in current generated in each case.

An MRAM uses a spin transfer torque (STT) phenomenon to write data to a memory cell. The STT phenomenon refers to a phenomenon that a spin-polarized current is transferred as an angular momentum of a ferromagnetic material by a change of an angular momentum instantly generated when the spin-polarized current passes through the ferromagnetic material. More specifically, when a high-density current having a polarized spin direction is applied to a ferromagnetic material, data is written using a phenomenon where a spin direction of a current is aligned when a magnetization direction of a ferromagnetic material does not correspond to a spin direction of a current.

In an MTJ used in a semiconductor memory, when electrons flow from a pinned layer to a free layer, the magnetization direction of the free layer corresponds to the magnetization direction of the pinned layer due to a flow of electrons whose spin directions are aligned in the magnetization direction of the pinned layer. On the other hand, when electrons flow from the free layer to the pinned layer, a spin accumulation phenomenon occurs at an interface between the pinned layer and the free layer, so that the magnetization direction of the free layer is anti-parallel to the magnetization direction of the pinned layer. Therefore, data can be written in the magnetization direction of the free layer.

SUMMARY OF THE INVENTION

Embodiments of the present invention are directed to a magnetoresistive memory device using tunneling magneto-resistance and a manufacturing method thereof.

In accordance with an embodiment of the present invention, a method for manufacturing a semiconductor memory device includes: sequentially depositing a bottom electrode layer, an MTJ layer, a first top electrode layer, a second top electrode layer and a mask layer; etching the mask layer and forming a mask pattern; etching the second top electrode layer and the first top electrode layer by using the mask pattern as an etch barrier; etching the MTJ layer by using the mask layer and the second top electrode layer as an etch barrier; and etching the bottom electrode layer by using the first top electrode layer as an etch barrier.

In accordance with another embodiment of the present invention, a method for manufacturing a semiconductor memory device includes: sequentially depositing a bottom electrode layer, a magnetic tunnel junction (MTJ) layer, a first top electrode layer, a second top electrode layer and a mask layer; etching the mask layer and forming a mask pattern; etching the second top electrode layer and the first top electrode layer by using the mask pattern as an etch in barrier; and etching the MTJ layer and the bottom electrode layer by using the mask layer and the second top electrode layer as an etch barrier.

In accordance with another embodiment of the present invention, a semiconductor memory device includes: a bottom electrode, an MTJ, and a first top electrode which are sequentially deposited, wherein the MTJ is formed by being etched using a second top electrode layer which is deposited over the first top electrode, as an etch barrier, wherein the second top electrode layer is etched to expose the first top electrode during an etching process of the MTJ, and wherein the bottom electrode is etched using the first top electrode as an etch barrier.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

A method for manufacturing a semiconductor memory device in accordance with an embodiment of the present invention will be described with reference to FIGS. 1 through 5.

First, a method for manufacturing a semiconductor memory device in accordance with an embodiment of the present invention as a method for manufacturing a semiconductor memory device including a magnetic tunnel junction (MTJ) includes depositing a bottom electrode layer, an MTJ layer, a first top electrode layer, a second top electrode layer and a mask layer; etching the mask layer to form a predetermined pattern; etching the second top electrode layer and the first top electrode layer by using the etched mask layer as an etch barrier; etching the MTJ layer by using the mask layer and the second top electrode layer as an etch barrier; and etching the bottom electrode layer by using the first top electrode layer as an etch barrier.

Figure 1:
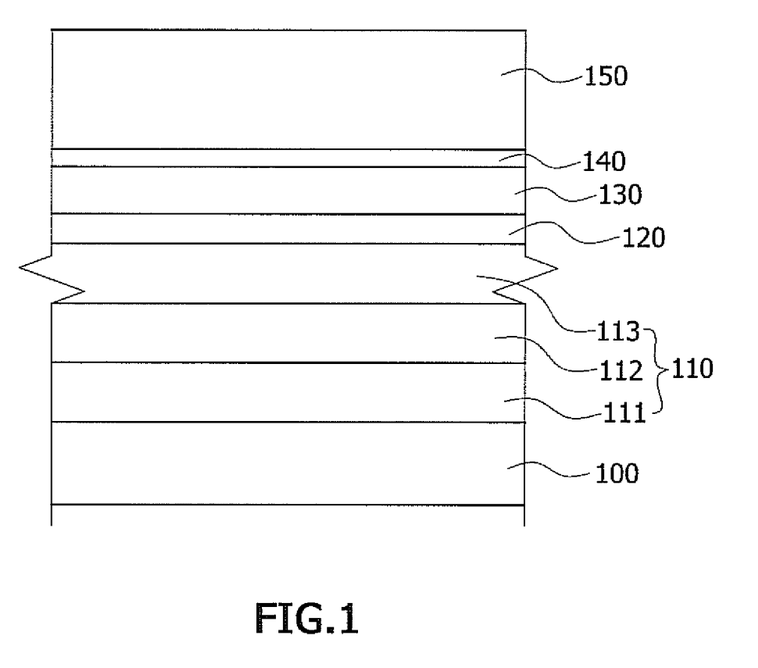
FIG. 1 is a view illustrating a state in which a bottom electrode layer, an MTJ layer, a magnetization reversal characteristic improvement layer, a first top electrode layer, a second top electrode layer, and a mask layer are deposited.

Referring to FIG. 1, a bottom electrode layer 100, an MTJ layer 110 which is formed by stacking a pinned layer 111, a tunneling barrier layer 112 and a free layer 113, a first top electrode layer 130, a second top electrode layer 140, and a mask layer 150 are sequentially deposited.

At this time, in order to improve magnetization reversal characteristics of an MTJ to be formed through subsequent processes, a magnetization reversal characteristic improvement layer 120 may be formed to be interposed between the MTJ layer 110 and the first top electrode layer 130. The magnetization reversal characteristic improvement layer 120 may be formed of any one of Ru, W, Pt, TiN and Ta. According to an example, the magnetization reversal characteristic improvement layer 120 may be formed of Ru.

The bottom electrode layer 100 may be formed of Ti, Ta, TaN, W, WN or WSi. According to an example, the bottom electrode layer 100 may be formed of TiN.

The first top electrode layer 130 is formed of a substance which has a high etching selectivity with respect to the MTJ layer 110 and the bottom electrode layer 100 in the course of etching the MTJ layer 110 and the bottom electrode layer 100 through subsequent processes and has a high electrical conductivity. According to an example, the first top electrode layer 130 may be formed of tungsten (W) which satisfies all these conditions.

The second top electrode layer 140 may be formed of any one of Ta, a tantalum oxide (Ta oxide), Ti, a titanium oxide (Ti oxide), MgO and Ru which have a high etching selectivity in the course of etching the MTJ to be formed through subsequent processes. According to an example, the second top electrode layer 140 may be formed of Ta.

The MTJ layer 110 is formed by stacking the pinned layer 111, the tunneling barrier layer 112 and the free layer 113. In this regard, since the structure and the manufacturing method of the MTJ layer 110 are well known to a person skilled in the art, detailed description thereof is omitted herein.

Figure 2:
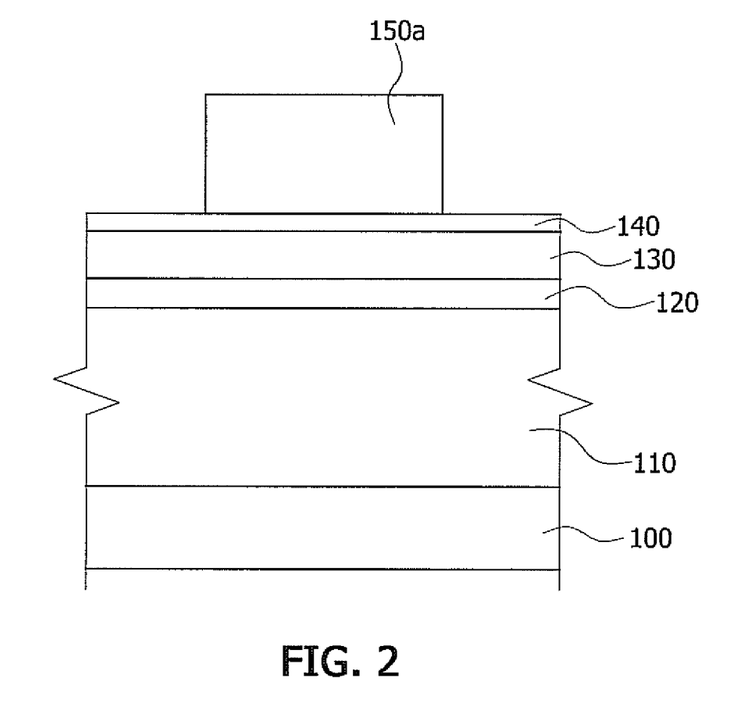
FIG. 2 is a view illustrating a state in which the mask layer is etched and a mask pattern is formed.
Figure 3:
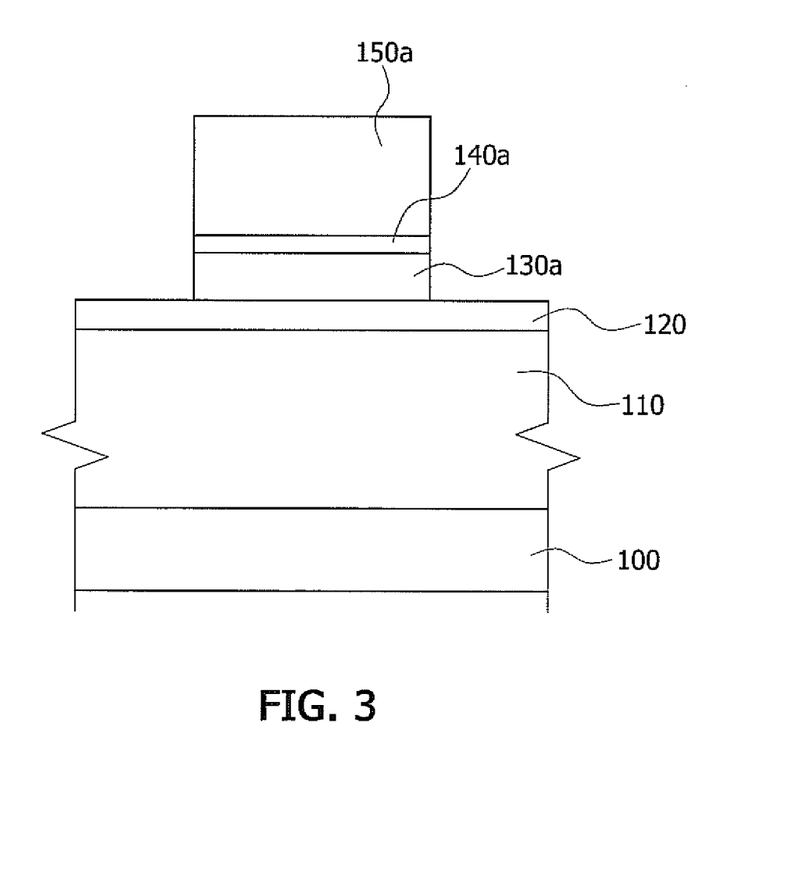
FIG. 3 is a view illustrating a state in which the second top electrode layer and the first top electrode layer are etched.

Then, referring to FIG. 2, a mask pattern 150a is formed by etching the mask layer 150. By etching the second top electrode layer 140 and the first top electrode layer 130 using the mask pattern 150a as an etch barrier, a second top electrode 140a and a first top electrode 130a are formed. The state in which the second top electrode 140a and the first top electrode 130a are formed is shown in FIG. 3.

Etching gases such as $SF_6$, $NF_3$, HBr, $CF_4$ and $CL_2$ may be used when forming the second top electrode 140a by etching the second top electrode layer 140. Also, etching gases such as $SF_6$, $NF_3$, HBr, $CF_4$ and $CL_2$ may be used when forming the first top electrode 130a by etching the first top electrode layer 130.

Figure 4:
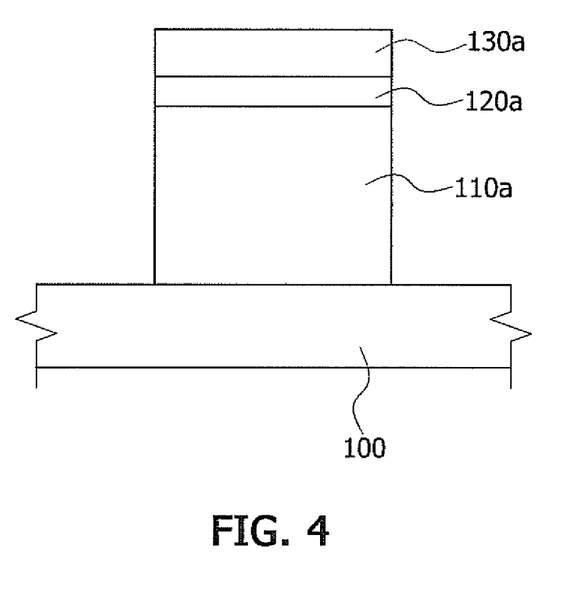
FIG. 4 is a view illustrating a state in which the second top electrode layer is removed, and the first top electrode layer, the magnetization reversal characteristic improvement layer and the MTJ layer are etched.

By etching the magnetization reversal characteristic improvement layer 120 and the MTJ layer 110 sequentially using the remaining mask pattern 150a and the second top electrode 140a as an etch barrier, respectively, a magnetization reversal characteristic improvement film 120a and an MTJ 110a are formed.

When etching the MTJ layer 110, the mask pattern 150a is more quickly etched than the MTJ layer 110. Therefore, when forming the MTJ 110a, the second top electrode 140a mainly functions as an etch barrier.

In the case where the second top electrode 140a is utilized as an etch barrier, since the second top electrode 140a has a slower etching speed than the MTJ layer 110, the MTJ 110a can be formed with less loss.

In such a process, the MTJ layer 110 may be etched using at least any one etching gas of $CH_3OH$, CO, $NH_3$, $Cl_2$, $SF_6$ and $NF_3$.

If the second top electrode layer 140 functioning as an etch barrier in the etching process for forming the MTJ 110a is formed to be thick, a lifting phenomenon may occur in which the second top electrode layer 140 lifts due to a stress induced by the first top electrode layer 130 made of a different material from the second top electrode layer 140.

The second top electrode layer 140 may be entirely etched in an etching process for forming the MTJ 110a. For example, in the case where the second top electrode layer 140 is formed to be relatively thin, the second top electrode layer 140 is etched to expose the first top electrode layer 130 while etching the MTJ layer 110.

Therefore, where the second top electrode layer 140 is to be etched away completely when the etching of the MTJ 110a is completed, the second top electrode layer 140 is formed to have an appropriate height. In this regard, the second top electrode layer 140 may be formed to have a height of 100 Å to 500 Å.

The state where the MTJ 110a has been formed through the foregoing procedures is shown in FIG. 4.

Thereafter, in order to protect the MTJ 110a and the first top electrode 130a through subsequent processes, sidewall spacers (160 in FIG. 5) are formed by depositing a silicon nitride at a low temperature of 400° C. or below.

Figure 5:
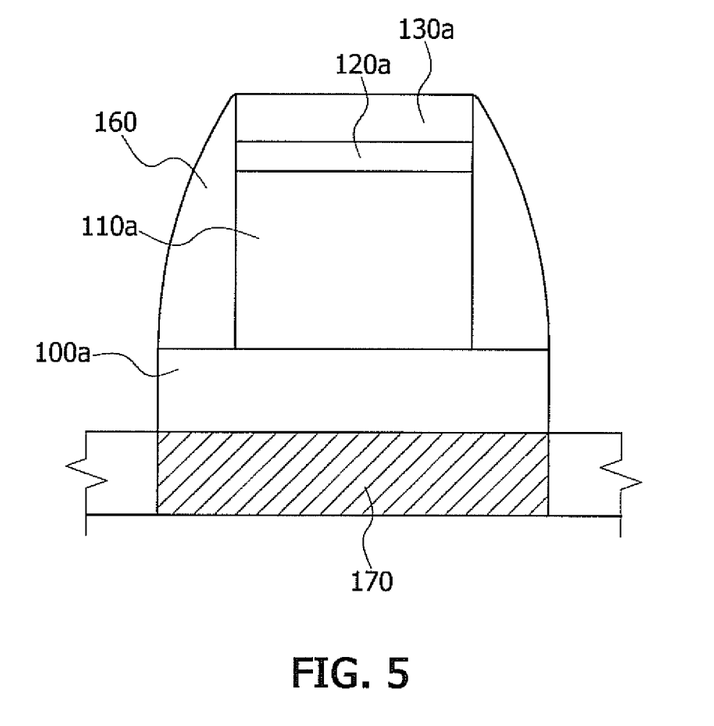
FIG. 5 is a view illustrating a state in which sidewall spacers are formed and a bottom electrode is formed through etching.

Referring to FIG. 5, by etching the bottom electrode layer 100 using the first top electrode 130a and the sidewall spacers 160 as an etch barrier, a bottom electrode 100a is formed. At this time, since a thickness margin of the first top electrode 130a is desired for subsequent chemical mechanical polishing, a thickness of the first top electrode 130a, which remains when the formation of the bottom electrode 100a is completed, may be equal to or greater than 300~1,000 Å.

To this end, the first top electrode 130a functioning as an etch barrier has an appropriate etching selectivity so as not to be completely etched away during the etching. Further, a thickness of the first top electrode layer 130 may be appropriately selected when the first top electrode layer 130 is initially formed.

In order to realize an appropriate etching selectivity, etching is performed using an appropriate etching gas. If etching is performed using a gas such as $SF_6$, $NF_3$, $BCl_3$, HBr, $CF_4$ and $CL_2$, since etching of TIN constituting the bottom electrode 100a proceeds faster than etching of tungsten (W) constituting the first top electrode 130a, the loss of tungsten of the first top electrode layer 130 may be minimized.

Moreover, in order to maintain the height of the first top electrode 130a, the first top electrode layer 130 may be formed to a thickness of 700 Å.

The state in which the bottom electrode 100a is formed through the above-described procedure is shown in FIG. 5. The bottom electrode 100a formed through the foregoing processes is electrically connected with a unit memory cell (not shown) or an external circuit (not shown) through a metal line 170 which is placed thereunder.

In another embodiment of the present invention, the process for forming the sidewall spacers may be omitted, and a process for forming the MTJ 110a by etching the MTJ layer 110 using the remaining mask pattern 150a and the second top electrode 140a as an etch barrier and a process for forming the bottom electrode 100a by etching the bottom electrode layer 100 may be simultaneously performed.

At this time, since the mask pattern 150a is more quickly etched than the etched MTJ layer 110 and the bottom electrode 100a, the second top electrode 140a mainly functions as an etch barrier. A thickness of the first top electrode 130a, which remains when the formation of the bottom electrode 100a is completed, may be equal to or greater than 300~1,000 Å. In order to realize an appropriate etching selectivity, an appropriate etching gas is to be used. According to an example, etching may be performed using a $CH_3OH$ gas.

Hereinbelow, a method for forming a unit memory cell formed according to the present invention in comparison to a conventional method for forming a unit memory cell by using an MTJ is described.

In the conventional art, after depositing a bottom electrode layer constituted by TiN, an MTJ layer, a ruthenium layer, a first top electrode layer constituted by TiN, and a mask layer, the first top electrode layer is etched through patterning.

Figure 6:
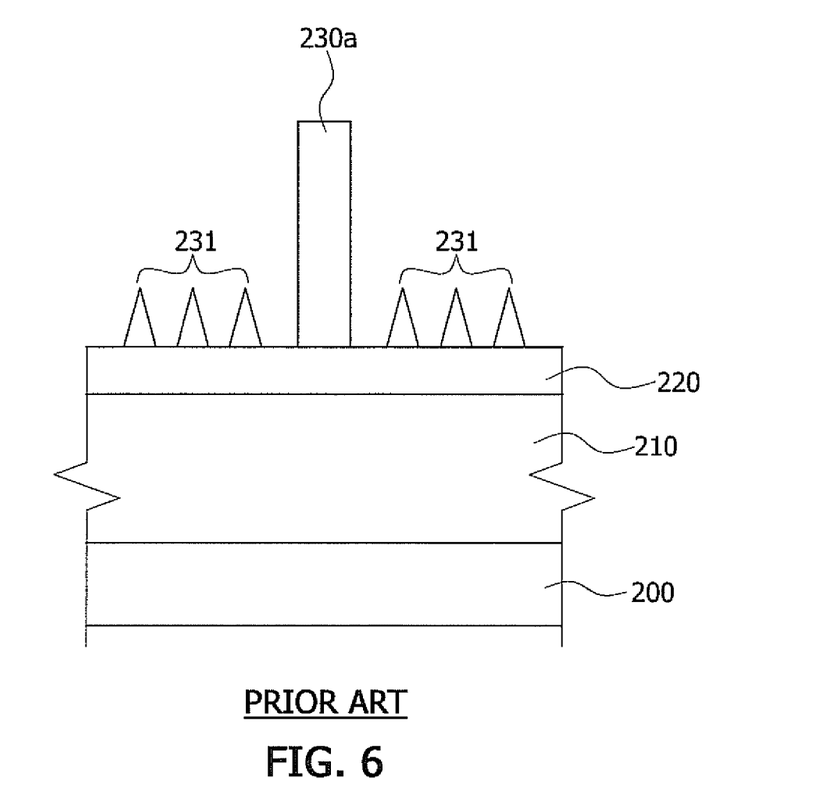
FIG. 6 is a view illustrating a state in which etching residues of a titanium nitride remain according to a conventional method.

Since the crystals of TiN grow in a vertical direction even in a situation where a ruthenium layer 220 is exposed as shown in FIG. 6 in the course of performing an etching process for forming a first top electrode 230a, etching residues 231 exist. In order to sufficiently remove the etching residues 231, TiN is over-etched.

Moreover, in the course of forming a bottom electrode by etching a bottom electrode layer 200 where an MTJ is formed by etching the ruthenium layer 220 and an MTJ layer 210 after the over-etch, since substances constituting a first top electrode 230a and the bottom electrode are the same as a titanium nitride (TiN), an etching selectivity becomes 1:1. Therefore, the first top electrode 230a is etched to the same degree that the bottom electrode is etched.

Accordingly, in order to obtain the first top electrode 230a with a sufficient height in a state in which the bottom electrode is completely etched, form the titanium nitride (TiN) is initially formed to have a height equal to or greater than 1,600 Å to thereby form the first top electrode 230a.

Figure 7A:
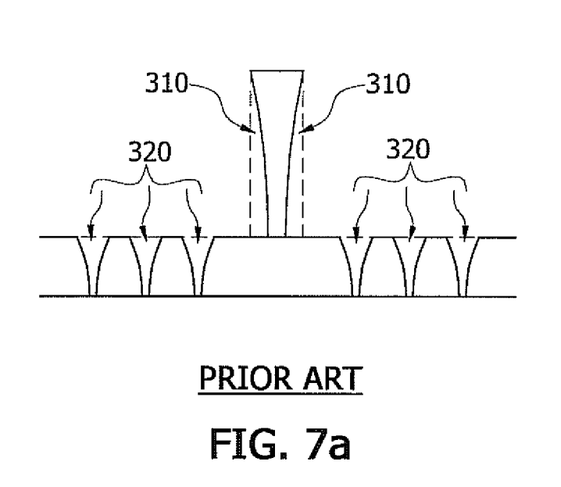
FIG. 7a is a view illustrating a state in which the sidewall of a first top electrode is etched and punches are defined in a ruthenium layer by over-etch for removing the etching residues of the titanium nitride according to a conventional method.

At this time, in the course of performing over-etch to form NI the first top electrode 230a, the sidewall of TiN constituting the first top electrode 230a is likely to be etched as indicated by the reference numeral 310 in FIG. 7a, and, as a result, a phenomenon occurs in which the first top electrode 230a collapses.

Furthermore, damage to a lower ruthenium layer 220 may be caused by the over-etch performed for removing the etching residues 231 of TiN, by which punches 320 may also be caused. By the presence of the punches 320, oxygen is introduced into a magnesium oxide (MgO layer constituting the MTJ layer. As a consequence, a wet attack occurs in the course of performing etching for forming the MTJ, and a loss equal to about 20% of the thickness of the MTJ may be caused.

In addition, etched ruthenium may be redeposited on the titanium nitride constituting the first top electrode 230a in the course of etching the ruthenium layer 220 and the MTJ layer 210.

Figure 7B:
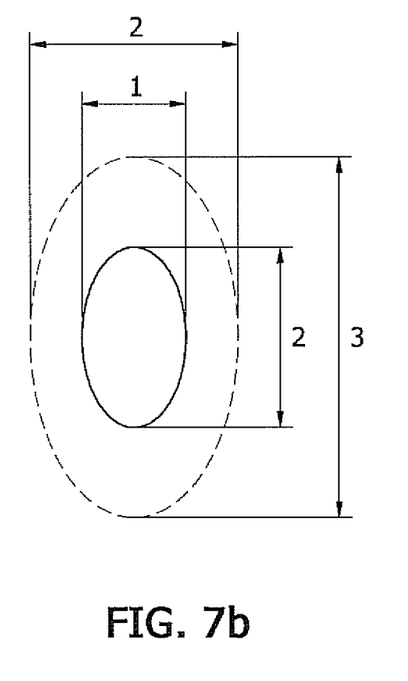
FIG. 7b is a view illustrating a state in which an aspect ratio deteriorates by redeposition of the ruthenium layer.

More specifically, while the first top electrode 230a is to have the shape shown by the solid line in FIG. 7b, as ruthenium is redeposited, the first top electrode 230a is formed to have the shape shown by the dotted line in FIG. 7b after etching of the MTJ.

At this time, if the original intended ratio (AR) is 1:2, it can be seen that the AR value of the first top electrode 230a actually formed by the redeposition of ruthenium (Ru) is altered to have, for example, to 2:3, that is, 1:1.5.

Accordingly, as an AR value deteriorates, the characteristics of a device are degraded. The deterioration of an AR value becomes more pronounced as the ruthenium layer is formed to be thick in order to prevent the occurrence of a wet attack and thus the characteristics of the device further deteriorate.

However, according to exemplary embodiment of the present invention, since the residues 231 of the titanium nitride TiN are not produced in the course of forming the first top electrode 230a, the over-etch is not necessary and thus the wet attack phenomenon may be overcome. Also, since it is not necessary to form the titanium nitride TiN with a great height as the first top electrode layer 230, the collapse of the first top electrode 230a may be solved.

Furthermore, a phenomenon where etched ruthenium is redeposited on the titanium nitride constituting the first top electrode 230a in the course of etching the ruthenium layer 220 and the MTJ layer 210 and cause an AR value to deteriorate and degrade the characteristics of a device may be avoided.

Hereafter, a unit memory cell of the present invention is described.

A unit memory cell according to exemplary embodiment of the present invention as a semiconductor memory device includes a bottom electrode, an MTJ and a first top electrode which are sequentially deposited. The MTJ is formed through etching by using a second top electrode layer which is deposited over the first top electrode, as an etch barrier. The bottom electrode is formed after etching with the first top electrode operating as an etch barrier.

The unit memory cell may further include sidewall spacers 160 which are formed as a silicon oxide or a silicon nitride, and a ruthenium (Ru) 120a may be formed to be interposed between the MTJ 110a and the first top electrode 130a.

The unit memory cell according to the present invention, constructed as mentioned above, is described in detail with reference to FIG. 5.

The first top electrode 130a of the unit memory cell according to the present invention may be formed of any of tantalum (Ta), a tantalum oxide (Ta oxide), titanium (Ti) and an aluminum oxide ($Al_2O_3$), and the bottom electrode 110a may be formed of any one of a titanium nitride (TiN) and a tantalum nitride (TaN).

In order to secure a sufficient height margin in a subsequent chemical mechanical polishing (CMP) process, the first top electrode 130*a* may be formed to have a height of 300~1,000 Å.

The MTJ 110 is formed through etching by using the second top electrode layer 140 deposited over the first top electrode as an etch barrier, and the second top electrode layer may be etched completely in the course of completing the formation of the MTJ.

The bottom electrode 100*a* is formed using the spacers 160 and the first top electrode 130*a* as an etch barrier.

As is apparent from the above descriptions, according to the present invention, a magnetoresistive memory which prevents collapse of a first top electrode may be formed. Further, a magnetoresistive memory which is free from the loss of an MTJ due to a wet attack may be formed.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a bottom electrode, a magnetic tunnel junction (MTJ), and a first top electrode which are sequentially deposited,
   wherein the MTJ is formed by being etched using the first top electrode and a second top electrode layer which is deposited over the first top electrode as an etch barrier,
   wherein the second top electrode layer is etched to expose the first top electrode during an etching process of the MTJ, and
   wherein the bottom electrode is etched using the first top electrode as an etch barrier.

2. The semiconductor memory device according to claim 1, wherein a ruthenium (Ru) layer is interposed between the first top electrode and the MTJ.

3. The semiconductor memory device according to claim 1, further comprising:
   sidewall spacers formed using any one of a silicon oxide and a silicon nitride.

4. The semiconductor memory device according to claim 1, wherein the first top electrode is formed of a substance which has a high etching selectivity with respect to the MTJ and the bottom electrode and a high electrical conductivity when compared to the MTJ and the bottom electrode.

5. The semiconductor memory device according to claim 1, wherein the first top electrode is formed of tungsten (W).

6. The semiconductor memory device according to claim 1, wherein the second top electrode layer is formed of a substance which has a high etching selectivity with respect to the MTJ.

7. The semiconductor memory device according to claim 1, wherein the second top electrode layer is formed of any one selected from the group consisting of Ta, an oxide containing Ta, Ti and $Al_2O_3$.

* * * * *